(12) United States Patent
Heid et al.

(10) Patent No.: US 9,246,495 B2
(45) Date of Patent: Jan. 26, 2016

(54) RESONATOR ARRANGEMENT AND METHOD FOR EXCITING A RESONATOR

(75) Inventors: Oliver Heid, Erlangen (DE); Timothy Hughes, Erlangen (DE); Jennifer Sirtl, Fürth (DE)

(73) Assignee: SIEMENS AKTIENGESELLSCHAFT (DE)

( * ) Notice: Subject to any disclaimer, the term of this patent is extended or adjusted under 35 U.S.C. 154(b) by 0 days.

(21) Appl. No.: 14/386,047

(22) PCT Filed: Mar. 21, 2012

(86) PCT No.: PCT/EP2012/054995
§ 371 (c)(1),
(2), (4) Date: Sep. 18, 2014

(87) PCT Pub. No.: WO2013/139389
PCT Pub. Date: Sep. 26, 2013

(65) Prior Publication Data
US 2015/0048893 A1    Feb. 19, 2015

(51) Int. Cl.
| | | |
|---|---|---|
| H05H 7/18 | (2006.01) | |
| H03B 21/01 | (2006.01) | |
| H03B 5/18 | (2006.01) | |
| H01P 7/06 | (2006.01) | |
| H03L 7/00 | (2006.01) | |
| H05H 7/02 | (2006.01) | |
| H03B 1/02 | (2006.01) | |

(52) U.S. Cl.
CPC .. *H03L 7/00* (2013.01); *H01P 7/06* (2013.01); *H03B 1/02* (2013.01); *H03B 5/1817* (2013.01); *H03B 21/01* (2013.01); *H05H 7/02* (2013.01); *H05H 7/18* (2013.01); *H05H 2007/025* (2013.01)

(58) Field of Classification Search
CPC .. H03B 5/1817; H03B 5/1823; H03B 5/1829; H03B 21/00; H03B 21/01; H01P 7/06; H03L 7/00; H05H 7/02; H05H 2007/025; H05H 7/18
USPC ........... 331/79, 96, 107 DP, 9, 34, 42, 40, 37; 333/227, 228; 378/137; 313/359.1; 315/5, 500, 39
See application file for complete search history.

(56) References Cited

U.S. PATENT DOCUMENTS

| | | | |
|---|---|---|---|
| 2,790,905 A * | 4/1957 | Wright | 331/9 |
| 2,887,580 A | 5/1959 | Bischoff | |
| 2008/0068112 A1 | 3/2008 | Yu et al. | |
| 2010/0038563 A1 | 2/2010 | Chen et al. | |
| 2011/0188638 A1 | 8/2011 | Treas et al. | |

OTHER PUBLICATIONS

International Search Report for PCT Application No. PCT/EP2012/054995, International Filing Date: Mar. 21, 2012; 2 pgs.

* cited by examiner

*Primary Examiner* — Ryan Johnson
(74) *Attorney, Agent, or Firm* — Schmeiser Olsen & Watts LLP

(57) ABSTRACT

A method for exciting a resonator having a resonance frequency, the resonator is excited in a first period with a first frequency that differs from the resonance frequency by a first frequency difference is provided. During a second period, the resonator is excited with a second frequency that differs from the resonance frequency by a second frequency difference. The first frequency difference and the second frequency difference have different signs. Additionally, the amounts of the first frequency difference and of the second frequency difference differ from one another by less than 10% of the greater amount.

11 Claims, 3 Drawing Sheets

RESONATOR ARRANGEMENT AND METHOD FOR EXCITING A RESONATOR

CROSS-REFERENCE TO RELATED APPLICATIONS

This application claims priority to PCT Application No. PCT/EP2012/054995, having a filing date of Mar. 21, 2012, the entire contents of which are hereby incorporated by reference.

FIELD OF TECHNOLOGY

The following relates to a method for exciting a resonator, and to a resonator arrangement comprising a resonator and an excitation device.

BACKGROUND

Resonators, i.e. systems that are able to oscillate, exist in many variants. By way of example, resonators can be embodied as RF cavities, in which electromagnetic oscillations can be excited. The use of such RF cavities in particle accelerators for accelerating electrically charged particles is known.

In order to excite and maintain a resonator oscillation, energy must be supplied to the resonator from an external source by means of an excitation device. To this end, radiofrequency sources are used in resonators, embodied as RF cavities, of particle accelerators. It is conventional to regulate an output amplitude of these radiofrequency sources in order to regulate the amount of energy fed into the resonator. However, when using solid-state switches for the excitation in particular, this ability to modulate the amplitude requires significant outlay and reduces the efficiency of the known excitation devices.

SUMMARY

An aspect relates to an improved method for exciting a resonator. A further aspect relates to providing an improved resonator arrangement comprising a resonator and an excitation device.

In a method according to embodiments of the disclosure for exciting a resonator having a resonant frequency, the resonator excited during a first time period with a first frequency which differs from the resonant frequency by a first frequency difference. During a second time period, the resonator is excited with a second frequency which differs from the resonant frequency by a second frequency difference. Here, the first frequency difference and the second frequency difference have different signs. Moreover, the magnitudes of the first frequency difference and of the second frequency difference differ from one another by less than 10% of the larger magnitude. In other words, the first frequency and the second frequency therefore lie as symmetrically as possible around the resonant frequency. Less energy is fed to the resonator by the excitation with the first and second frequencies, which differ from the resonant frequency. As a result of the approximately symmetrical position of the first frequency and the second frequency around the resonant frequency, a phase shift of the resonator oscillation, caused by the excitation of the resonator with frequencies that differ from the resonant frequency, is averaged out. The method thereby renders it possible to regulate the power fed into the resonator without varying the amplitude of the excitation. As a result, the method can, in a technically advantageous manner, be implemented without much outlay.

In an exemplary embodiment of the method, first time periods and second time periods repeatedly follow one another. The first time periods and the second time periods can then be selected to be very short in each case, as a result of which the phase shifts, caused by the excitation of the resonator with the first frequency and the second frequency, of the resonator oscillation can be averaged out in a particularly effective manner.

It is expedient for the first time period and the second time period to have the same length. This also supports particularly effective averaging out of phase shifts of the resonator oscillation.

In an exemplary embodiment of the method, the resonator is excited with a constant excitation amplitude during the first time period and the second time period. The method can then be implemented without regulating the excitation amplitude.

In a development of the method, the resonator is excited with the resonant frequency during a further time period. The power fed to the resonator during the further time period then increases.

The resonator is preferably excited with a constant excitation amplitude during the first time period, the second time period and the further time period. Preferably, in order to excite the resonator, it is then possible to use an excitation device which need not necessarily render it possible to regulate the excitation amplitude.

In an exemplary embodiment of the method, the first frequency difference and the second frequency difference are increased if an oscillation amplitude of the resonator is to be reduced. This enables a reduction in the power of the resonator oscillation without it being necessary to modify the excitation amplitude for this purpose.

In a likewise embodiment of the method, the first frequency difference and the second frequency difference are reduced if an oscillation amplitude of the resonator is to be increased. Advantageously, this also enables a regulation of the power of the resonator oscillation without it being necessary to vary an excitation amplitude.

A resonator arrangement according to the invention comprises a resonator and an excitation device for exciting an oscillation of the resonator. Here, the excitation device is embodied to carry out a method of the aforementioned type. It is not necessary in this case to embody the excitation device with a modifiable output amplitude. As a result, the excitation device can be embodied in a simple manner and have high efficiency.

In one embodiment of the resonator arrangement, the oscillation is an electromagnetic oscillation. Advantageously, the resonator arrangement can then be used for many technical purposes.

In an exemplary embodiment of the resonator arrangement, the resonator is embodied as an RF cavity. RF cavities can be used for many technical purposes.

In a particular embodiment of the resonator arrangement, the resonator is a resonator of a particle accelerator. The resonator from the resonator arrangement can then be used to accelerate electrically charged particles. As a result of the huge energy consumption of particle accelerators, an embodiment of the excitation device, made possible in this resonator arrangement, with high efficiency is particularly expedient.

In one embodiment of the resonator arrangement, the excitation device comprises a solid-state switch. The use of solid-state circuits enables a compact, cost-effective and energy efficient embodiment of the excitation device.

BRIEF DESCRIPTION

Some of the embodiments will be described in detail, with reference to the following figures, wherein like designations denote like members, wherein.

DETAILED DESCRIPTION

Figure 1:
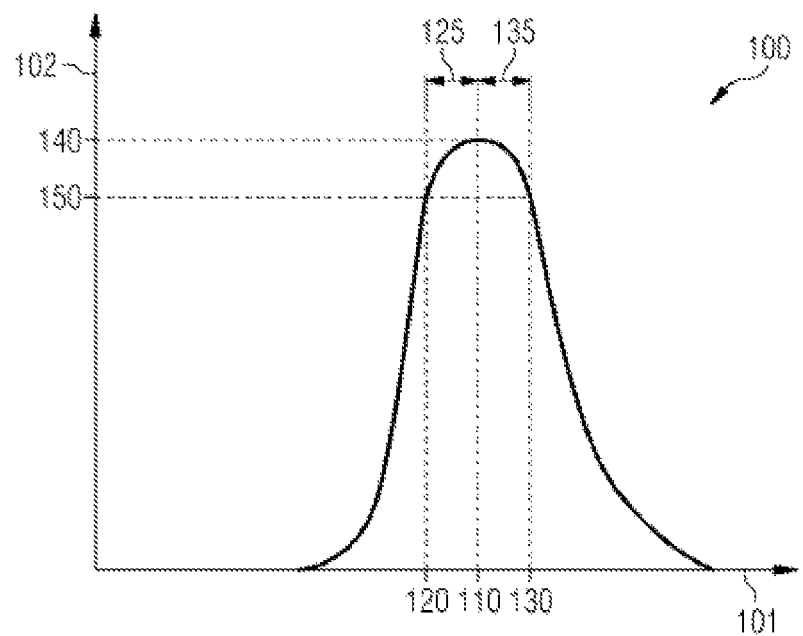
FIG. 1 shows an exemplary amplitude/frequency response of a resonator.

FIG. 1 shows, in a schematic illustration, a graph of an amplitude/frequency response 100 of a resonator. In principle, each resonator has a comparable amplitude/frequency response. By way of example, in the present case, the resonator can be an RF cavity, in which an electromagnetic oscillation can be excited.

An excitation frequency 101 is plotted on a horizontal axis of the graph in FIG. 1. The excitation frequency 101 specifies a frequency with which a resonator oscillation of the resonator is excited from an external source. An oscillation amplitude 102 is plotted on a vertical axis of the graph in FIG. 1. The oscillation amplitude 102 specifies an amplitude of the resonator oscillation of the resonator and therefore represents a measure for energy stored in the resonator oscillation. The amplitude/frequency response 100 in FIG. 1 specifies the amplitude of the resonator oscillation which sets-in in the case of an excitation of the resonator with a specific excitation frequency 101. Therefore, the amplitude/frequency response 100 in FIG. 1 specifies the energy fed into the resonator, depending on the excitation frequency 101 of the external excitation, by the external excitation.

The amplitude/frequency response 100 has a maximum amplitude 140 at a resonant frequency 110 of the resonator. The amplitude excited in the resonator drops off in the case of excitation frequencies 101 which are greater than or less than the resonant frequency 110 of the resonator. Thus, the excited resonator oscillation at a reduced frequency 120, which is less than the resonant frequency 110, only has a reduced amplitude 150. In the case of an increased frequency 130, which is greater than the resonant frequency 110, the resonator oscillation likewise has the reduced amplitude 150. The drop in the amplitude/frequency response 100 away from the resonant frequency 110 becomes ever steeper with increasing quality of the resonator. The amplitudes at the reduced frequency 120 and at the increased frequency 130 could also differ from one another.

The reduced frequency 120 differs from the resonant frequency 110 by a first frequency difference 125. The increased frequency 130 differs from the resonant frequency 110 by a second frequency difference 135. The first frequency difference 125 and the second frequency difference 135 have different signs. However, the first frequency difference 125 and the second frequency difference 135 preferably have approximately the same magnitudes. Then, the resonant frequency 110 lies centrally between the reduced frequency 120 and the increased frequency 130.

A resonator oscillation with the maximum amplitude 140 sets in if the resonator is excited with the resonant frequency 110. In this case the energy fed to the resonator is at a maximum. A resonator oscillation with the reduced amplitude 150 sets in if the resonator is excited with the reduced frequency 120 or with the increased frequency 130. Therefore, less energy is fed into the resonator by the external excitation in this case. Therefore, varying the excitation frequency 101, with which the resonator is excited, renders it possible to vary the energy fed into the resonator.

Figure 2:
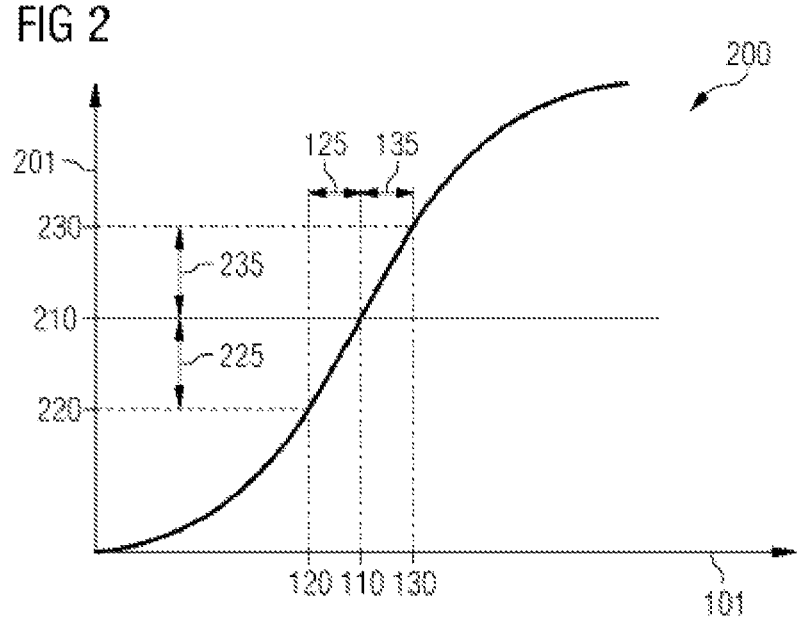
FIG. 2 shows an exemplary diagram of a phase between a resonator oscillation and an external excitation.

FIG. 2 shows, in a schematic illustration, a graph of a phase 200 between the external excitation of the resonator and the resonator oscillation setting-in in the resonator. The excitation frequency 101 of the external excitation is once again plotted on a horizontal axis. A phase shift 201 between the external excitation and the resonator oscillation is plotted on a vertical axis.

A resonant phase 210 between the external excitation and the resonator oscillation sets in when the resonator is excited with the resonant frequency 110. By way of example, the resonant phase 210 can be a phase shift of 90° between the excitation and the resonator oscillation. The phase shift 201 between excitation and resonator oscillation changes away from the resonant frequency 110. Thus, a first phase 220 sets in when exciting the resonator with the reduced frequency 120 and a second phase 230 sets in when exciting the resonator with the increased frequency 130. In general, this is undesirable. What is desired is that the phase shift 201 between the external excitation and the resonator oscillation remains at the resonant phase 210.

However, in the example depicted in FIGS. 1 and 2, the reduced frequency 120 and the increased frequency 130 are selected in such a way that the first phase 220 differs from the resonant phase 210 by a first phase change 225 and the second phase 230 differs from the resonant phase 210 by a second phase change 235. In the depicted embodiment, the first phase change 225 and the second phase change 235 have different signs, but approximately the same magnitudes. Thus, the reduced frequency 120 and the increased frequency 130 are selected in such a way that the first phase 220 setting-in in the case of excitation with the reduced frequency 120 and the phase 230 setting-in in the case of excitation with the increased frequency 130 are arranged as symmetrically as possible about the resonant phase 210; i.e., the first phase change 225 and the second phase change 235 have magnitudes which are as identical as possible. It is less important whether the same reduced amplitude 150 sets-in in the case of excitation with the reduced frequency 120 and in the case of excitation with the increased frequency 130. It is not critical if a different oscillation amplitude 102 sets in at the reduced frequency 120 compared to at the increased frequency 130.

When using a high-quality resonator, the aforementioned requirement is satisfied when the reduced frequency 120 and the increased frequency 130 are arranged approximately symmetrically around the resonant frequency 110; i.e., the first frequency difference 125 and the second frequency difference 135 have magnitudes which are approximately equal. The magnitudes of the first frequency difference 125 and of the second frequency difference 135 preferably differ by less than 10% of the larger magnitude. The magnitudes of the first frequency difference 125 and of the second frequency difference 135 particularly preferably differ by an even substantially smaller fraction, for example by merely 5% or 1% of the larger magnitude.

If the resonator is alternately excited by the reduced frequency 120 and the increased frequency 130, the resulting phase changes 225, 235 compensate one another. The functioning quality of this compensation improves the faster the intervals of the excitation with the reduced frequency 120 and with the increased frequency 130 follow one another. By way of example, this can be achieved by virtue of a jitter being applied to the excitation frequency in a controlled manner.

Figure 3:
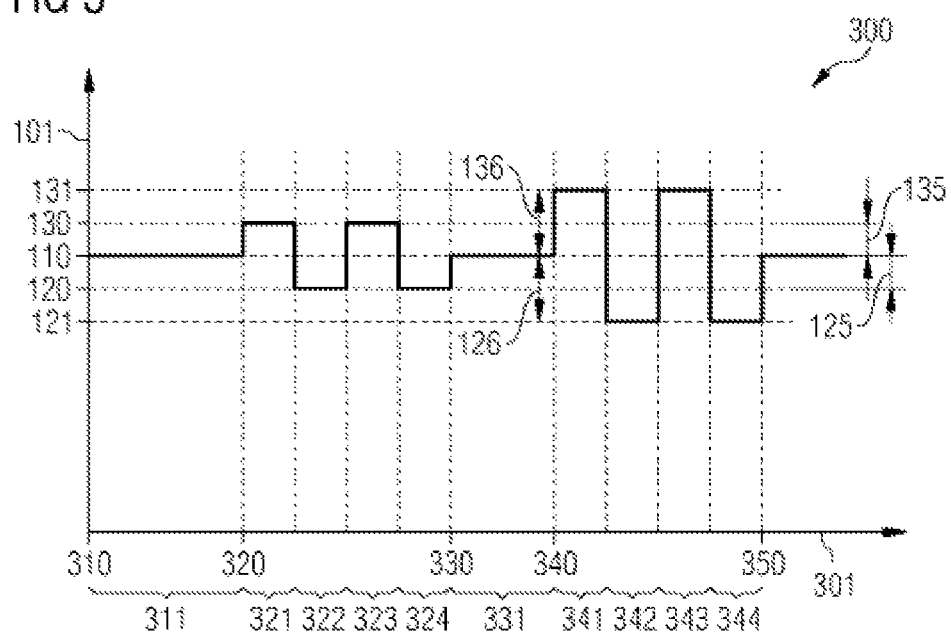
FIG. 3 shows an excitation frequency profile of an excitation of a resonator.

FIG. 3 shows a schematic excitation frequency profile 300 brought about by controlling the power of a resonator without, in the process, modifying an amplitude of the excitation of the resonator. Time 301 is plotted on a horizontal axis of the graph in FIG. 3. The excitation frequency 101, with which the resonator is excited, is plotted on a vertical axis of the graph.

Figure 4:
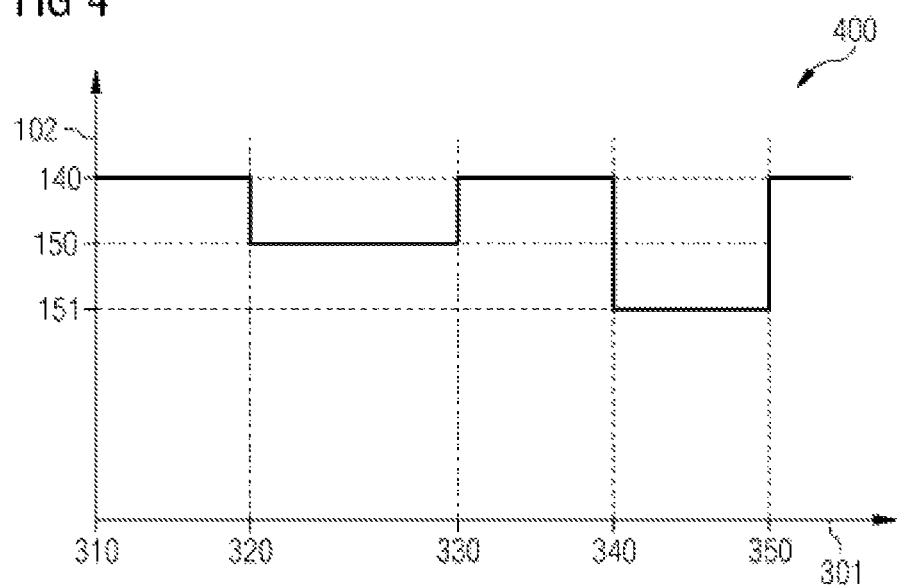
FIG. 4 shows an amplitude profile of a resonator oscillation.

FIG. 4 shows, in a schematic graph, an amplitude profile 400 of the oscillation amplitude of the resonator oscillation setting in during the excitation of the resonator in accordance with the excitation frequency profile 300 in FIG. 3. Therefore, time 301 is likewise plotted on the horizontal axis of the graph in F 4. The oscillation amplitude 102 of the resonator oscillation is depicted on the vertical axis of the graph.

The resonator is excited with the resonator frequency 110 during a first time period 311 between a first time 310 and a second time 320 following the first time 310 in time. Therefore, the maximum amplitude 140 of the resonator oscillation sets in between the first time 310 and the second time 320 in the resonator.

The energy fed into the resonator is reduced between the second time 320 and a third time 330. To this end, the time between the second time 320 and the third time 330 is subdivided into a second time period 321, a third time period 322, a fourth time period 323 and a fifth time period 324. The time periods 321, 322, 323, 324 preferably have approximately the same duration in each case. The resonator is excited with the increased frequency 130 during the second time period 321 and the fourth time period 323. The resonator is excited with the reduced frequency 120 during the third time period 322 and the fifth time period 324. It follows that, between the second time 320 and the third time 330, a resonator oscillation with the reduced amplitude 150 sets-in in the resonator. Thus, the power fed into the resonator between the second time 320 and the third time 330 is less than between the first time 310 and the second time 320. Since the resonator is always excited in an alternating manner with the increased frequency 130 and the reduced frequency 120 between the second time 320 and the third time 330, the phase changes 225, 235 between the excitation and the resonator oscillation emerging in the process average out. Therefore, averaged over time, the phase shift 201 between the excitation and the resonator oscillation remains at the resonant phase 210.

Between the second time 320 and the third time 330, the resonator is only excited with the increased frequency 130 during two time periods 321, 323 and excited with the reduced frequency 120 during two time periods 322, 324 in the schematic illustrations in FIGS. 3 and 4. However, the time interval between the second time 320 and the third time 330 is preferably subdivided into substantially more individual time periods with different excitation frequencies 101. That is to say, the reduced frequency 120 and the increased frequency 130 alternate substantially more frequently.

The resonator is once again excited with the resonant frequency 110 during a sixth time period 331 between the third time 330 and a fourth time 340. As a result, the resonator oscillation once again assumes the maximum amplitude 140 between the third time 330 and the fourth time 340. Therefore, the power fed into the resonator is once again at a maximum between the third time 330 and the fourth time 340.

The power fed into the resonator between the fourth time 340 and a fifth time 350 is to be reduced even more than between the second time 320 and the third time 330. This is achieved by virtue of the resonator alternately being excited between the fourth time 340 and the fifth time 350 with a second reduced frequency 121 and a second increased frequency 131. Here, the second reduced frequency 121 differs from the resonant frequency 110 by a third frequency difference 126. The second increased frequency 131 differs from the resonant frequency 110 of the resonator by a fourth frequency difference 136.

The third frequency difference 126 and the fourth frequency difference 136 have different signs and approximately corresponding magnitudes. However, the magnitude of the third frequency difference 126 is greater than the magnitude of the first frequency difference 125. The magnitude of the fourth frequency difference 136 is greater than the magnitude of the second frequency difference 135. It is clear from FIG. 1 that the frequency differences 126, 136, which are increased compared to the frequency differences 125, 135, additionally reduce the power fed into the resonator in the case of excitation with the second increased frequency 131 and the second reduced frequency 121 compared to an excitation of the resonator with the reduced frequency 120 and the increased frequency 130.

In the schematic illustration of FIGS. 3 and 4, the time interval between the fourth time 340 and the fifth time 350 is subdivided into a seventh time period 341, an eighth time period 342, a ninth time period 343 and a tenth time period 344. However, the time interval between the fourth time 340 and the fifth time 350 could also be subdivided into a substantially larger number of individual time periods. The resonator is excited with the second increased frequency 131 during the seventh time period 341 and the ninth time period 343. The resonator is excited with a second reduced frequency 121 during the eighth time period 342 and the tenth time period 344. Subsequently, an oscillation with a second reduced amplitude 151 sets in between the fourth time 340 and the fifth time 350. The second reduced amplitude 151 is lower than the maximum amplitude 140 and also lower than the reduced amplitude 150. Hence, the power fed into the resonator between the fourth time 340 and the fifth time 350 is lower than during any other time between the first time 310 and the fourth time 340.

As a result of the third frequency difference 126 and the fourth frequency difference 136 having approximately equal magnitudes, i.e. the second reduced frequency 121 and the second increased frequency 131 being arranged approximately symmetrically around the resonant frequency 110, the phase changes between the excitation and the resonator oscillation setting in as a result of the excitation of the resonator with the second reduced frequency 121 and the second increased frequency 131 compensate one another when averaged out over time between the fourth time 340 and the fifth time 350.

Therefore, the method explained on the basis of FIGS. 1 to 4 renders it possible to control the power of a resonator. In the process, the excitation amplitude with which the resonator is excited need not be varied during this method. Rather, the frequency with which the resonator is excited is varied. If the resonator is excited with the resonant frequency thereof, the power fed into the resonator is at a maximum. If the resonator is excited with a frequency different from the resonant frequency, the power fed into the resonator reduces, with, however, there also being a change in a phase shift between the excitation and the resonator oscillation. However, if the resonator is excited in a quickly alternating manner with two different frequencies that lie approximately symmetrically about the resonant frequency, the resulting phase shifts average out. The power fed into the resonator reduces, with increasing distance of the two excitation frequencies, from the resonant frequency of the resonator. The functioning of the method improves with an increased quality of the resonator. The excitation frequency can be varied by applying the excitation frequency with a jitter.

Figure 5:
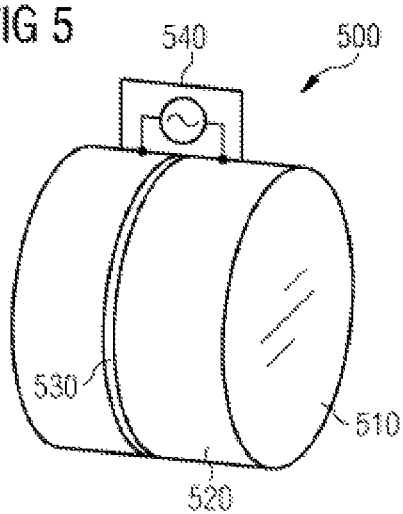
FIG. 5 shows a schematic resonator arrangement.

FIG. 5 shows a schematic illustration of an exemplary resonator arrangement 500, which is suitable for carrying out the described method. By way of example, the resonator arrangement 500 can be a resonator arrangement in a particle accelerator for accelerating electrically charged particles.

The resonator arrangement 500 comprises a resonator 510. In the depicted example, the resonator 510 is embodied as an RF cavity. In the depicted example, the resonator 510 is a so-called pillbox resonator with a cylindrical form. A lateral surface of the cylindrical resonator 510 is formed by a metallic resonator wall 520.

An electromagnetic oscillation can be excited in the resonator 510. To this end, the resonator wall 520 comprises a circumferential slit 530, in which an electrically insulating material is arranged. An excitation device 540 is arranged over the slit 530, said excitation device preferably comprising a solid-state switch. It is possible by means of the excitation device 540 to induce a radiofrequency electric current flow between the two sections of the resonator wall 520 delimited from one another by the slit 530, as a result of which a resonator oscillation is excited in the resonator 510.

The excitation device 540 is embodied to excite the resonator 510 in accordance with the method described above. The excitation device 540 varies the frequency of the voltage applied to the resonator wall 520 across the slit 530 in order to control the power fed into the resonator 510. Here, the output amplitude of the excitation device 540 remains constant. An advantage of this is that the excitation device 540 can be embodied with a fixed amplifier chain which need not be changeable. As a result of this, a design of the excitation device 540 advantageously emerges.

Moreover, this advantageously renders it possible to embody the excitation device 540 with a high effectiveness.

Even though the disclosure was, in detail, illustrated and described more closely by the exemplary embodiment, the disclosure is not restricted by the disclosed examples. A person skilled in the art can derive other variations herefrom, without departing from the scope of protection of the invention.

The invention claimed is:

1. A method for exciting a resonator having a resonant frequency, comprising the steps of:
 exciting the resonator during a first time period with a first frequency which differs from the resonant frequency by a first frequency difference;
 exciting the resonator during a second time period with a second frequency, wherein the said second frequency differs from the resonant frequency by a second frequency difference, wherein the first frequency difference and the second frequency difference have different signs, wherein the magnitudes of the first frequency difference and the second frequency difference differ by less than 10% of the larger magnitude; and
 one of the following steps a) and b):
 a) increasing the first frequency difference and the second frequency difference to reduce an oscillation amplitude of the resonator; and
 b) reducing the first frequency difference and the second frequency difference to increase an oscillation amplitude of the resonator.

2. The method as claimed in claim 1, wherein the first time period and the second time period repeatedly follow one another.

3. The method as claimed in claim 1, wherein the first time period and the second time period have the same length.

4. The method as claimed in claim 1, wherein the resonator is excited with a constant excitation amplitude during the first time period and the second time period.

5. The method as claimed in claim 1, further comprising the step of exciting the resonator with the resonant frequency during a further time period.

6. The method as claimed in claim 5, wherein the resonator is excited with a constant excitation amplitude during the first time period, the second time period and the further time period.

7. A resonator arrangement comprising:
 a resonator; and
 an excitation device configured for exciting an oscillation of the resonator, wherein the excitation device is excitable during a first time period with a first frequency which differences from a resonant frequency by a first frequency difference and a second time period with a second frequency, wherein said second frequency differs from the resonant frequency by a second frequency difference having different signs, wherein the magnitudes of the first frequency difference and the second frequency difference differ by less than 10% of the larger magnitude, and wherein the excitation device is configured for one of: increasing the first frequency difference and the second frequency difference to reduce an oscillation amplitude of the resonator; and reducing the first frequency difference and the second frequency difference to increase an oscillation amplitude of the resonator.

8. The resonator arrangement as claimed in claim 7, wherein the oscillation is an electromagnetic oscillation.

9. The resonator arrangement as claimed in claim 8, wherein the resonator is an RF cavity.

10. The resonator arrangement as claimed in claim 7, wherein the resonator is a resonator of a particle accelerator.

11. The resonator arrangement as claimed in claim 7, wherein the excitation device further comprises a solid-state switch.

* * * * *